United States Patent [19]

Devoe et al.

[11] Patent Number: 5,657,199

[45] Date of Patent: Aug. 12, 1997

[54] CLOSE PHYSICAL MOUNTING OF LEADED AMPLIFIER/RECEIVERS TO THROUGH HOLES IN MONOLITHIC, BURIED-SUBSTRATE, MULTIPLE CAPACITORS SIMULTANEOUS WITH ELECTRICAL CONNECTION TO DUAL CAPACITORS OTHERWISE TRANSPIRING, PARTICULARLY FOR HEARING AID FILTERS

[76] Inventors: Daniel F. Devoe, 610 First St., Coronado, Calif. 92118; Alan D. Devoe, 5715 Waverly Ave., La Jolla, Calif. 92037

[21] Appl. No.: 528,856

[22] Filed: Sep. 15, 1995

Related U.S. Application Data

[60] Continuation-in-part of Ser. No. 342,595, Nov. 21, 1994, abandoned, which is a division of Ser. No. 964,150, Oct. 21, 1992, Pat. No. 5,367,430.

[51] Int. Cl.$^6$ ........................................ H01G 4/38
[52] U.S. Cl. ................... 361/328; 361/303; 361/306.3; 361/321.2; 361/313
[58] Field of Search ........................ 361/302, 303, 361/306.1, 306.3, 307, 313, 321.2, 321.1, 321.3, 321.4, 321.5, 328, 763, 782, 811, 821; 334/78–82; 333/182, 181, 185, 183; 29/25.42; 174/250

[56] References Cited

U.S. PATENT DOCUMENTS

| | | | |
|---|---|---|---|
| 3,379,943 | 4/1968 | Breedlove | 361/321.2 |
| 5,177,663 | 1/1993 | Ingleson et al. | 361/321.2 |
| 5,497,129 | 3/1996 | Mantese et al. | 333/182 |

*Primary Examiner*—Leo P. Picard
*Assistant Examiner*—Anthony Dinkins
*Attorney, Agent, or Firm*—William C. Fuess

[57] ABSTRACT

Leaded electrical circuits and components, typically receivers and amplifiers used in micro-miniature hearing aids, are closely physically mounted by their leads extending within laser-drilled through-holes, typically three such holes, to multiple buried-substrate capacitors within a monolithic ceramic multiple capacitor. Electrical connection to the leads does not transpire within the holes, but rather though soldered or like connection to conductive pads surrounding the holes and continuing first as circuit traces on the top of the monolith, and then as electrically-conductive trace or castellations on the sides of the monolith, until reaching electrodes of the buried-substrate capacitors patterned so as to be brought to side surfaces of the monolith. The direct electrical connection is normally to multiple plates of plural buried-substrate capacitors, typically including a relatively large, typically 1.0 μfarad, capacitor in electrical parallel with a smaller, typically 100 picofarads, capacitor. Both capacitances jointly serve as an effective filter to noise in two separate frequency bands, typically centered about 100 kHz and about 100 MHz.

8 Claims, 6 Drawing Sheets

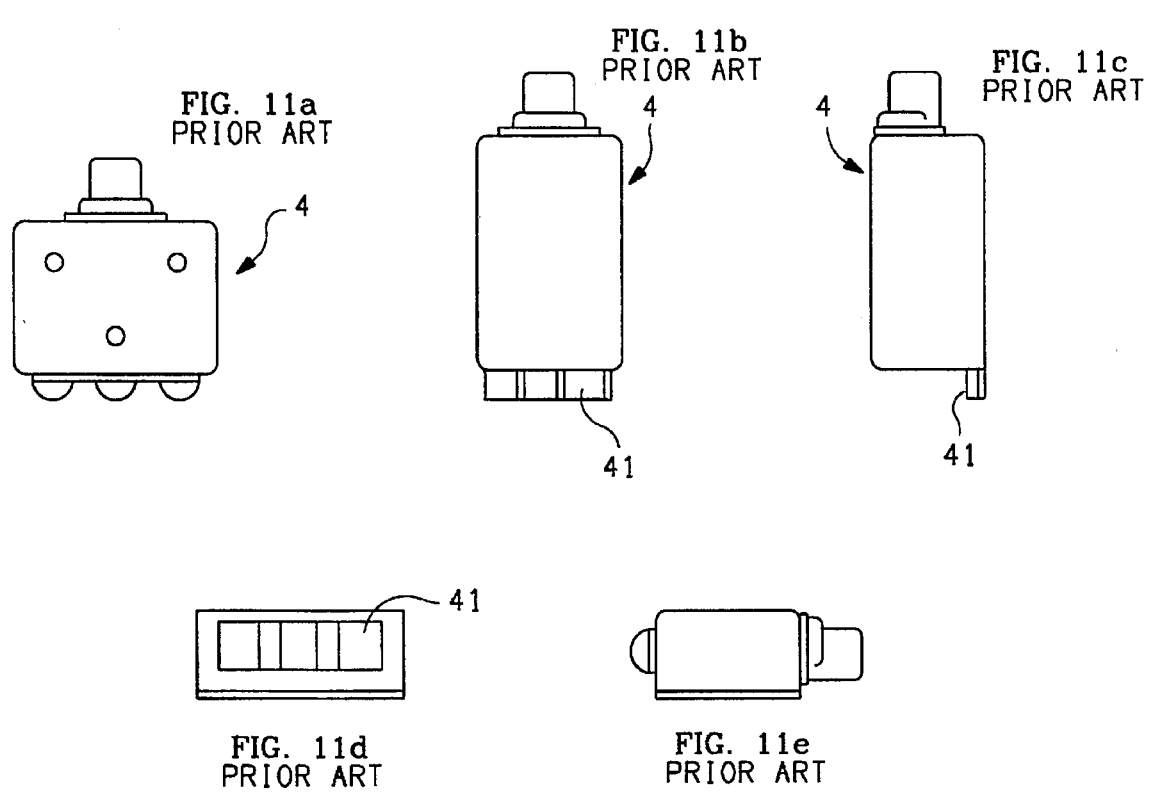
FIG. 11a PRIOR ART
FIG. 11b PRIOR ART
FIG. 11c PRIOR ART
FIG. 11d PRIOR ART
FIG. 11e PRIOR ART
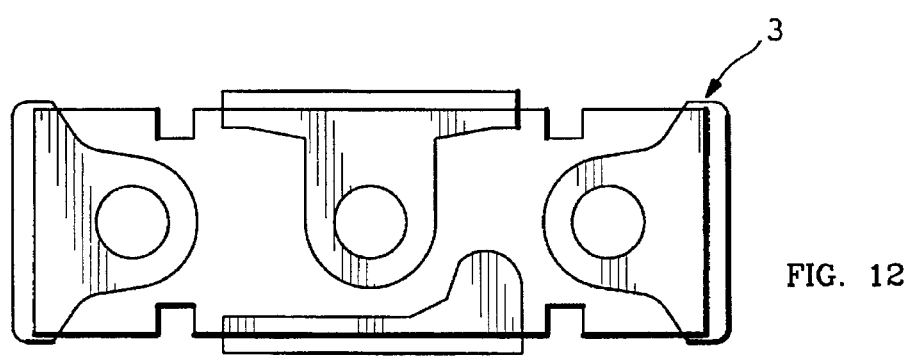
FIG. 12
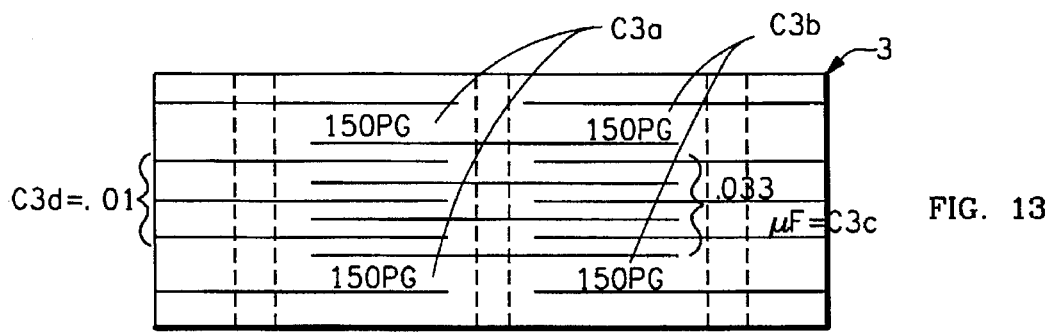
FIG. 13

CLOSE PHYSICAL MOUNTING OF LEADED AMPLIFIER/RECEIVERS TO THROUGH HOLES IN MONOLITHIC, BURIED-SUBSTRATE, MULTIPLE CAPACITORS SIMULTANEOUS WITH ELECTRICAL CONNECTION TO DUAL CAPACITORS OTHERWISE TRANSPIRING, PARTICULARLY FOR HEARING AID FILTERS

REFERENCE RELATION TO THE RELATED PATENT APPLICATIONS

The present patent application is a continuation-in-part of U.S. patent application Ser. No. 08/342,595 filed on Nov. 21, 1994, now abandoned. That application is itself a divisional of U.S. patent application Ser. No. 07/964,150 filed on Oct. 21, 1992 for a MONOLITHIC MULTIPLE CAPACITOR to inventors Alan D. Devoe and Daniel F. Devoe, now issued on Nov. 22, 1994, as U.S. Pat. No. 5,367,430.

The present application is also related to U.S. patent application Ser. No. 08/528,885 filed on an even date herewith for PRINTING AND ADHERING PATTERNED METAL ON A LAID-UP MULTI-LAYER GREEN WAFER BEFORE FIRING SO AS TO LATER FORM PRECISE INTEGRAL CO-FIRED CONDUCTIVE TRACES AND PADS ON SELECTED TOP AND BOTTOM SURFACES OF MONOLITHIC, BURIED-SUBSTRATE, CERAMIC MULTIPLE CAPACITORS DICED FROM THE WAFER, INCLUDING PADS SUPPORTING SURFACE MOUNTING AND/OR MOUNTING IN TIERS and also to U.S. patent application Ser. No. 08/528,855 filed on an even date herewith for a MONOLITHIC, BURIED-SUBSTRATE, CERAMIC MULTIPLE CAPACITORS ISOLATED, ONE TO THE NEXT, BY DUAL-DIELECTRIC-CONSTANT, THREE-LAYER-LAMINATE ISOLATION LAYERS, both of which applications are to the same two inventors as is the present application.

The contents of the predecessor, and of the two related, patent applications are incorporated herein by reference.

BACKGROUND OF THE INVENTION

1. Field of the Invention

The present invention generally concerns monolithic multiple buried-substrate capacitors, particularly miniature buried-substrate capacitors such as are useful in small electronic circuits, including in hearing aids that are inserted in the external acoustic meatus, or ear canal.

The present invention particularly concerns the physical—mechanical and thermal—mounting of electrical circuits and components on and to monolithic multiple buried-substrate capacitors, and the simultaneous electrical connection—realized other than by the physical mounting—of such circuits and components to the buried capacitors that are located within the monolith. The mounted and electrically connected electrical circuits and components are commonly monolithic integrated circuit transistor receivers and/or amplifiers particularly as are used in hearing aids, and the electrically-connected buried capacitors particularly serve as a filter.

2. Description of the Prior Art

2.1 The Structure of Monolithic Multiple Buried-Substrate Capacitors

Monolithic buried-substrate, and multiple buried-substrate, capacitors are sometimes identified with the two words "substrate" and "capacitor" reversed, and are called Buried Capacitor Substrates, or BCS. Howsoever called, BCS accord significant size reduction to microelectronic applications. A BCS integrates capacitors, resistors and traces into a thin multi-layer substrate, which can be joined with IC devices. Volumetric reductions of 50 to 75% are possible because the BCS eliminates the air gaps between passive components and replaces the alumina substrate of traditional hybrids. This accords the freedom to mount one or more ICs onto the BCS (or perhaps even one on each side) and then attach the device to a ribbon lead, larger hybrid, or Multi Chip Module. The BCS is also compatible with flip chip IC Designs, giving the most dense hybrids presently possible, circa 1995.

Substrate density and parasitic management are the technological keys to BCS Miniaturization. A BCS desirably uses the finest possible spacing for electrical connections around the edge of the chip (020"), offering the greatest number of connections between the IC and buried capacitors. Inside the chip, multi-layer technologies are used. Stray capacitance within the chip is controlled by (i) use of high and low K dielectrics, and (ii) the unique castellation cutting technique taught in the related U.S. Pat. No. 5,367,430 for a MONOLITHIC MULTIPLE CAPACITOR. These techniques combine to give low noise between internal capacitors and maintain parasitic capacitance at low levels.

The surface metallization of the BCS is made from co-fired material. It is commonly available in either an as-fired solderable, a nickel barrier solderable, or a gold over nickel wire bondable system. This allows the chip to be used in solder applications, various types of wire bonding, or flip-chip die attach. The chip can be solder attached to either a larger hybrid, a Multi Chip Module, or a flexible ribbon cable. IC's and discrete components can be attached to one or other sides. The surface traces are typically printed with 5 mil lines and 5 mil spaces in any pattern required to fit the application.

A series of castellations along the side of the BCS provide electrical connection from capacitors within the chip to the top and bottom surfaces. These castellations consist of metallized pads separated by 6 to 12 mil deep air gaps. A pitch 0.020 inches between castellations is possible, while still retaining excellent solder reflow characteristics. These castellation are, again, the subject of related U.S. Pat. No. 5,367,430 for a MONOLITHIC MULTIPLE CAPACITOR.

A soldered connection to a castellation can provide a variety of electrical connections: directly to the IC, through a passive component, then to the IC; or to the IC with a capacitor to ground. In cases where an IC on each side of the BCS requires many I/O connections, a series of castellations can be made with 5 mil pads and 5 mil spaces.

A series of castellations along the side of BCS provide electrical connection from capacitors within the body of the BCS to its top and bottom surfaces. These castellations consist of metallized pads separated by 6 to 12 mil deep air gaps. A pitch 0.020 inches between castellations is possible, while still retaining excellent solder reflow characteristics.

BCS can be produced in a variety of sizes. A typical minimum size is 0.070 by 0.070 inches. The size of a BCS will usually be chosen based on capacitance values desired, the voltage rating, and internal space needed to control stray capacitance. Any sizes up to 1" by 1" are possible, with maximum capacitance values near 10 uF: again, capacitance value achievable depends on voltage rating required.

Because BCS contain non-symmetric buried plates, variation in surface flatness can be expected. Production techniques allow three controls of this irregularity. BCS can be made so that the top surface is flat and the bottom surface contains all the irregularity. It can be made so that the bottom surface is flat and the top surface contains all the irregularity. Finally, a BCS can be made so that the irregularity is averaged on both sides, so that it is equally absorbed by the top and bottom surfaces.

Internal conductor traces can be used to connect castellations on one area of the chip to the other. Usually this is needed when internal capacitor arrangements make conventional layouts impossible, or to accommodate existing IC pad locations. The layer of traces can be put in at any level within the chip, depending on what is optimal for reducing stray capacitance.

Various designs of the internal plates of a BCS are possible. Capacitance value depends on the active area of each capacitor and the number of layers used.

It is possible to design one or more capacitors against an internal ground plane. By changing the position of connecting tabs, almost any connection configuration can be achieved.

Shielded capacitors are created by having a series of capacitor plates which are surrounded by two ground planes. This shielding can occur above and below the capacitor or along the edge of the device.

Coupling capacitors can be designed using a stack of individual opposing plates. Again, capacitance value depends on the number of layers and the active area of each chip.

In a typical BCS device, capacitors are stacked in different levels within the chip; one or more capacitors are built on each level, and each capacitor tabs out to a different castellation. Typically one castellation would connect to all internal ground planes.

Stray capacitance between different internal capacitors is controlled by varying the distance between the capacitors on the same level or by varying the layer thickness between levels.

BESS are commonly made from any of NPO, X7R, and Z5U dielectrics. For ease of designing a substrate, the dielectrics can be thought of as capacitance achieved per unit area, given a normalized dielectric thickness.

For an area 0.1 inches on a side, at a dielectric thickness of 0.001 inches, capacitance values are as follows:

| Dielectric | Cap per .01 in square @ 1.0 mil thick |
| --- | --- |
| NPO | 312.7 pF |
| X7R | 7417 pF |
| Z5U | 26.477 pF |

2.2 The Use of, and Previous Electrical Connection to, Monolithic Multiple Buried-Substrate Capacitors Monolithic multiple buried-substrate capacitors contain, just as their name indicates, multiple capacitors within a single, monolithic, body. Monolithic multiple buried-substrate capacitors are typically electrically connected to, and useful in combination with, small, integrated, electronic devices, including amplifiers and receivers of hearing aids that are inserted in the external acoustic meatus, or ear canal. The substantial purpose of putting multiple buried-substrate capacitors within a single monolith is to save volume; otherwise a number of separate chip capacitors could be conventionally employed.

Electrical connections to multiple buried-substrate capacitors are, however, multiplied by the number of such separate connections to be made, and aggravated by the typical microminiature size of a multiple buried-substrate capacitor—typically as small as 0.070"×0.070"×0.020" thickness—and by the commensurate microminiature size to the electronic devices to which it is connected.

The connected electronic devices—amplifiers and receivers and the like requiring connection to external capacitors for filtering purposes—are typically provided with leads. It has been known to place holes, or bores, in the body of a multiple buried-substrate capacitor—including by process of laser drilling—and to then attempt to place the leads in the bores to attempt down-hole electrical connection with selected electrodes of the buried capacitors. This effort has essentially come to naught. In the first place, the hole placement, by laser drilling or otherwise, tends to displace the conductive material of the electrodes that are penetrated down hole, and to leave an insufficient amount of this material at the walls of the bores at, and only at, the regions of the exposed down-hole electrodes so as to permit electrical connection to be reliably made. Moreover, and equally importantly, it is all but impossible to wick solder into the typically small holes, the access to which may also be, should the electronic device be mounted flush as is desired, impeded.

Accordingly, the typical electrical connection of leaded electronic devices—amplifiers and receivers and the like—to the capacitors that are within the body of a multiple buried-substrate capacitor is by (i) bringing the electrodes of the capacitors to some localized, pad, region of the surface of the multiple buried-substrate capacitor, and then (ii) soldering the leads of the electronic devices to these pads. To say that this work is delicate and painstaking, and therefore expensive, is an understatement. It is typically performed by dexterous women viewing their soldering though microscopes. Difficulties in electrically connecting, circa 1995, one microminiature component to another is one reason that very, very small electronic items such as hearing aids that fit within the external acoustic meatus, or ear canal tend to be expensive, costing several hundreds and even thousands of dollars U.S. circa 1995.

One known way of reliably efficiently electrically small things is by reflow soldering. However, a microminiature multiple buried-substrate capacitor will generally not stay sufficiently precisely located to a microminiature electronic device, and vice versa, so as to reliably permit reflow soldering to transpire.

According to these difficulties, it would be useful if an improved electrical connection between at least a microminiature multiple buried-substrate capacitor and another microminiature electronic device, if not between microminiature electronic components and devices in general, could be developed.

2.3 Filters

The use of capacitors in filters is well understood. A major purpose of electrically connecting microminiature electronic devices such as audio amplifiers and receivers and the like (not necessarily in hearing aids, but also in, for example, telephones and radios) to microminiature multiple buried-substrate capacitors is to create capacitor filters.

It has been noticed by the inventors of the present invention that the capacitor filters so created are, while typically optimal for filtering one type of noise, not always optimal for filtering all the noise that is present at the location within the electronic circuit where the filter appears.

In particular, the most common, and pervasive, type on noise filter is directed to removing a relatively lowerfrequency, less than 100 kHZ, electrical noise that chiefly results from and arises in a modern-era switching-type power supply. Because reactance is a function of frequency, the high switching frequencies of switching-type power supplies permit miniaturization of the reactive components of these supplies, and of an entire supply. No one is suggesting that these switching-type power supplies should be supplanted or eliminated, it is simply the case that, at least in microminiature form, they are not noiseless.

Furthermore, and this time for reasons of communications theory, and of communications density and capacity, digital switching is very often occurring, and noise is attendantly being developed, at much higher frequencies of, for example, 100 Mhz. For example, and as an arbitrary example, consider the new GMS mobile telephones now in use in Europe. A 1 Ghz radio carrier is pulse modulated at, typically [100 Mhz?], at amplitudes up to 3 volts. The field strength at the microphone of a mobile telephone may easily approach 1100 volt/meter. This varying electrical, field is picked up in the leads of the microphone, and constitutes noise to the microphone audio amplifier.

It is know to construct filters of two, or more, capacitors to filter out noise in multiple frequency bands simultaneously. However, the problems of so doing in the microminiature, difficult-to-connect, realm of multiple buried-substrate capacitors are daunting. To the best knowledge of the inventors, it has not only not been previously attempted to construct multiple-capacitor filters at this size scale, but it has not even been recognized to be possible to do so.

2.4 Through-Holes

Through-holes have previously been placed in ceramic capacitors for purposes of mounting electrical components to the capacitors (equivalently; mounting the capacitors to electrical components) by wire leads that extend within the holes. The holes have heretofore been made by punching or by drilling, and are quite large (relative to the wire) as best suits the wicking of solder or conductive adhesive into the hole so that a wire inserted within the hole may be electrically connected in downhole regions to the plates of buried-substrate capacitors that are intentionally brought to the boundaries of the holes.

Two limitations are inherent in this scheme. First, because solder or conductive adhesive must be wicked into the hole that also contains the wire, clearance room must be provided at the top of the hole, making that the wired-leaded component cannot be mounted tight against the ceramic capacitor with holes. The necessary separation between holed capacitor and wire-leaded component not only results in reduced packing density, but also in reduced mechanical strength and tolerance to shock and vibration.

Second, it is known to drill laser holes, which can be quite small, in microminiature items. For purposes of putting multiple small holes in ceramic multiple capacitors, particularly, laser hole drilling would seemingly be of interest. However, a laser drilling of any ceramic capacitor, including a ceramic multiple capacitor, tends to cause destructive de-lamination, and or ablation of material, where the laser beam penetrates the conductive plates of the buried-substrate capacitor(s) in its (their) down-hole positions. The result of laser drilling a ceramic capacitor is a hole which, even if having satisfactory physical quality (which is difficult, and dubious), has insufficiently reliable continuity to electrodes exposed in down-hole so as to support reliable soldered (or conductively adhered) connection(s) of, wire(s) placed within the holes.

SUMMARY OF THE INVENTION

The present invention contemplates (i) the close mechanical mounting of leaded electrical devices—normally microminiature integrated transistor amplifiers and receivers—to and within through-holes that are laser drilled within ceramic capacitors, including monolithic buried-substrate ceramic multiple capacitors, while simultaneously (ii) realizing a soldered electrical connection—separately from the through-holes and normally by and through means of electrically-conductive castellations and circuit traces that are located on the surfaces of the monolith—between the leads of the electrical devices and one or more buried capacitors that are located within the monolith.

The electrodes of any buried-substrate capacitor or capacitors that would become exposed to the laser-drilled though-holes in down-hole regions of the holes are intentionally patterned during construction of the ceramic capacitor so as to be spaced apart from the regions of the holes. These electrodes of buried-substrate capacitor(s) are therefore not susceptible of d.c. electrical connection to any wires inserted within the holes. The laser-drilled through-holes are for mechanical connection only, although this mechanical connection may be, and commonly is (for reasons to be discussed momentarily) by use of solder or adhesive that is conductive.

Although the wire-leaded components mechanically mounted to the laser-drilled through-holes are not directly electrically connected in downhole regions, they are routinely connected, commonly by solder or by conductive adhesive, at and to conductive surface pads and traces located on the exterior surfaces of the ceramic capacitor. These exterior surface pads and traces may be located directly under the wire-leaded component—in which case mounting of the component to the ceramic capacitor (the ceramic capacitor to the component) is much like the soldered or other electrical connection of any wire-leaded component to a common printed circuit board with surface metallization.

The surface electrical connection of the wires at the regions of the holes—typically transpiring by soldering or by use of conductive adhesive—is to electrically-conductive pads of the top surface of the monolithic ceramic multiple capacitor. These conductive pads continue as conductive traces, preferably as are both fabricated by the method taught in the related co-pending patent application for PRINTING AND ADHERING PATTERNED METAL ON A LAID-UP MULTI-LAYER GREEN WAFER BEFORE FIRING SO AS TO LATER FORM PRECISE INTEGRAL CO-FIRED CONDUCTIVE TRACES AND PADS ON SELECTED TOP AND BOTTOM SURFACES OF MONOLITHIC, BURIED-SUBSTRATE, CERAMIC MULTIPLE CAPACITORS DICED FROM THE WAFER, INCLUDING PADS SUPPORTING SURFACE MOUNTING AND/OR MOUNTING IN TIERS.

At the edges of top surface of the monolithic ceramic multiple capacitor, the top traces connect over the edges to conductive circuit traces or castellations or the like that are located on the side surfaces of the monolith. These conductive circuit traces (or castellations, or the like) finally connect to plates of the buried-substrate capacitors (located within the monolith) which plates are patterned to selectively extend to selective positions on the side surfaces of the monolith. Accordingly, an electrical component's wire lead that may pass right though a plate of a buried-substrate capacitor in its position inserted down-hole in the ceramic multiple capacitor may ultimately be connected to the same plate though a more circuitous path.

Notably, multiple buried-substrate capacitors may be electrically connected in parallel—all as is determined by the patterning capacitor plates and surface traces in the ceramic multiple capacitor. Two capacitors of different capacitance values that are connected in electrical parallel may particularly be used, inter alia, as an effective dual-capacitor noise filter.

However, a lead need not always be inserted in a hole, and soldered to a surface pad or trace at this position. Especially when many, typically 5+, wires are to be electrically connected, then certain selected leads of the wired component, or, equivalently, jumper wires proceeding to/from connection regions or pads on the component, need not be placed into holes at all, but may instead simply span through space to remote pads where they are electrically connected by soldering or the like. This is, of course, no more than a traditional means of electrically connecting two components one of which components has and presents leads. A particular benefit in combining the mechanical and electrical connections of the present invention with the previous technique of surface-soldered wires is that the component, by virtue of such of its wire lead as do extend into and through holes, may be both (i) accurately positioned and (ii) stably held during a soldering or like operation—even on that lead (those leads) that does (do) not extend into the holes.

There is another, more esoteric, reason for functionally separating (i) the mechanical mounting, and (ii) the electrical connections—although both are preferably realized by the same operation of soldering or reflow soldering or adhering with conductive adhesive. This is so that (iii) a parasitic capacitance that is coupled by the electronic device's leads as are inserted within the monolith's holes will be in electrical parallel with (iv) another capacitance of a directly-electrically-connected buried capacitor. It is again possible to use both capacitances jointly as an effective dual-capacitor noise filter.

The mounted devices are, in general, electrical circuits. The mounted devices are more particularly monolithic integrated transistor receivers and/or amplifiers such as are commonly used in hearing aids. In one embodiment, typically three (3) directly-electrically-connected buried capacitors of a monolithic buried-substrate ceramic multiple capacitor are preset in value. A two of the capacitors that are electrically connected in parallel are so typically respectively so preset to about (i) 1.0 μfarads and (ii) 100 picofarads capacitance. When these two capacitors are connected in electrical parallel they serve to effectively filter noise in two separate frequency bands, typically centered about 100 kHz and about 100 MHz.

The two capacitors of a ceramic multiple capacitor that are electrically connected in parallel to an external, leaded, electrical component or circuit thus constitute a compact realization of a new and very compact electrical filter. This electrical filter, based on two different capacitances, is useful connected to and combined with a microminiature amplifier and/or receiver of the types that are particularly used in hearing aids, and that is more particularly used in hearing aids resident in the ear canal.

The present invention thus has another, further, aspect concerning a new mechanical mounting of a microminiature amplifier and/or receiver—particularly of those types particularly used in hearing aids, and more particularly in hearing aids that are resident in the ear canal—to a monolithic multiple buried-substrate capacitor simultaneously that electrical connections are also made for purposes of noise filtration.

The preferred embodiment of the invention is thus as a monolithic ceramic multiple substrate capacitor that is susceptible of simultaneous (i) physical—both mechanical and thermal—mounting, and (ii) electrical connection, to an electrical device or component having at least two leads. The monolithic multiple ceramic capacitor is in the substantial form of a three-dimensional body having and defining (i) an exterior surface, and (ii) a number of bores that are complimentary to, and suitable to physically receive, the at least two leads of the electrical device or component. The bores, and the surfaces of the bores, may pass proximately to, but do not directly electrically connect with, the electrodes of the buried-substrate capacitors that are located within the three-dimensional body of the monolithic ceramic multiple substrate capacitor.

At least one buried-substrate capacitor is located within the three-dimensional body—particularly a ceramic capacitor and more particularly a ceramic multiple capacitor. The at least one buried-substrate capacitor has both first and a second electrically-conducting plates. Each of these plates is electrically separately brought to one or more surfaces of the body, normally at the side surfaces of the ceramic multiple capacitor. Conductive traces, or conductive castellations, on these side surfaces connect to edges of a top surface of the ceramic multiple capacitor. Conductive traces proceed from pads located circumferentially about the through-holes upon the top surface of the ceramic multiple capacitor. These top-surface conductive traces connect to the side surface traces, or conductive castellations, at the their positions at the edges of the top surface.

Accordingly, electrically conductive (i) castellations, and/or (ii) traces on several surfaces of the ceramic multiple capacitor serve to connect the first and the second electrically-conducting plates as are brought to and exposed at the one or more surfaces of the capacitor's body to conductive pads respectively circumferentially surrounding each of the two bores. When leads of the electrical device are inserted into the bores and suitably electrically connected—preferably by soldering or reflow soldering or conductive adhesive—to the pads, a strong and reliable (i) mechanical and (ii) electrical union is made. By this construction the plates of at least one buried substrate capacitor are electrically connected to, and across, the at least two leads of the electrical device.

Additional leads of the electrical device may also be electrical connected to conductive pads circumferentially surrounding additional bores, and these pads may also Conversely, some electrical leads need not extend into bores at all, and may simply span to pads or other conductive pads or surfaces at other regions of the top surface, or even upon other, side, surfaces, of the ceramic multiple capacitor.

Finally, and rarely, it may be noted that the (at least) two leads of the electrical device that are fully inserted within two of the several bores that are within the body therein pass proximately to, but do not electrically connect with, the at least one buried-substrate capacitor. By this proximity of the leads to the buried-substrate capacitor, a parasitic capacitance that is separate from, and that is in electrical parallel with, the capacitance of the at least one buried-substrate capacitor is accordingly experienced between the two leads.

The net effect of this (i) mechanical mounting and (ii) electrical connection is that the electrical device—which is physically mounted to the three-dimensional body by its at least two leads—is also—again by the same at least two leads—electrically connected, normally in parallel, to any number of separate capacitances. A combination of two such capacitances is particularly useful as a filter.

The electrically-conductive traces may, in particular, be formed as (i) electrically-conductive castellations that proceed along the side exterior surfaces of the three-dimensional body, so as to further electrically connect to (ii) circuit traces that are located on a top exterior surface exterior surface of the three-dimensional body. The circuit traces terminate in the (iii) conductive pads circumferentially surrounding each of at least two bores.

The three-dimensional body may in particular include a number of interspersed layers of (i) electrically-insulating sintered ceramic material, and (ii) electrically-conducting material. These various layers need not be spatially co-extensive within the three-dimensional body. The at least one buried substrate capacitor typically consists of (i) a first layer of the electrically-conducting material forming the first electrically-conducting plate, and (ii) a second layer of the electrically-conducting material forming the second electrically-conducting plate. These first and second layers need not be spatially co-extensive with each other, either.

In this structure at least one, and normally all, the several bores are preferably formed as laser-drilled holes in the three-dimensional body. The at least two holes pass through both (i) the first layer of electrically-conducting material, and also (ii) the second layer of electrically-conducting material, without electrically connecting to either layer.

This electrical non-connection of the holes, or more properly the hole surfaces and any leads that are inserted within the holes, to either the first or the second layer of electrically-conducting material is normally, and preferably, due to the patterning of conductive plates of the buried-substrate capacitors; these plates being void in regions where the holes are laser-drilled. However, it may be considered that substantial absence of the plates within the holes would also occur as an inherent result of, the preferred drilling by laser. The laser drilling serves to ablate material of the layers of electrically-conducting material in down hole regions, and to naturally preclude that any sufficient amount of this material should remain at and on the interior surfaces of the hole in the down hole locations so as to permit of making electrical connection through the hole to either the first or the second layers. In either case, exactly what is desired is achieved. Because direct, d.c., electrical connection is neither intended to be made, nor made, through the laser-drilled holes, only a parasitic capacitance to the underlying, buried, layers is experienced by the electrical device that is otherwise physically mounted in the holes.

These and other aspects and attributes of the present invention will become increasingly clear upon reference to the following drawings and accompanying specification.

BRIEF DESCRIPTION OF THE DRAWINGS

FIG. 11, consisting of FIG. 11a through FIG. 11e, is a diagrammatic representation showing in plan view the packaging of a prior art leaded receiver or Class D driver usable in conjunction with preferred embodiments of the monolithic, buried-substrate, multiple capacitor in accordance With the present invention as was previously seen in FIGS. 1 through 6.

FIG. 12 is a top plan view showing a third preferred embodiment of monolithic, buried-substrate, multiple capacitor with through-holes in accordance with the present invention that is suitable to closely physically mount a leaded amplifier/receivers to its through-holes while it simultaneously electrically connects dual capacitors, particularly for the purpose of serving as an ultra-compact microminiature dual-capacitor filter to a hearing aid receiver.

FIG. 13 is a cut-away side plan view of the third preferred embodiment of a monolithic, buried-substrate, multiple capacitor with through-holes in accordance with the present invention previously seen in FIG. 12.

DESCRIPTION OF THE PREFERRED EMBODIMENT

Figure 1:
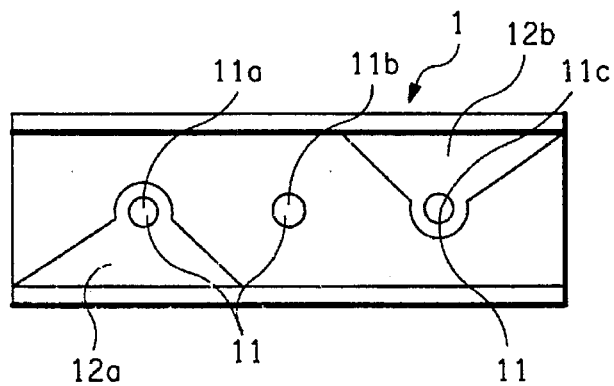
FIG. 1 is a top plan view showing an exemplary, first, preferred embodiment of monolithic, buried-substrate, multiple capacitor with through-holes in accordance with the present invention that is suitable to closely physically mount a leaded amplifier/receivers to its through-holes while it simultaneously electrically connects dual capacitors, particularly for the purpose of serving as an ultra-Compact microminiature dual-capacitor filter to a hearing aid microphone amplifier.

In accordance with the present invention, a monolithic, buried-substrate, ceramic multiple capacitor permits (i) one or more electrical components (including devices and circuits) to be physically mounted to the surface of the monolith, while (ii) an electrical connection is selectively made between each such component and at least one, and typically two or more, buried-substrate capacitors that are buried within the monolith. (Connection is also simultaneously made, to one or more additional, parasitic, capacitances. These parasitic capacitances may be use if desired.)

The manner of electrical connection is specifically directed to establishing a mechanical and electrical connection between one or more components, and buried-substrate capacitors within the monolithic ceramic multiple capacitor, that is each of (i) effective, (ii) economical, (iii) reliable, and (iv) compact.

Both the mechanical and electrical connections of the ceramic multiple capacitor and the mounted component are made through wire leads of the component which leads fit within complimentary bores of the monolith. The inside surfaces of the bores are electrically non-conducting; no direct conductive electrical connection is made a these locations (a capacitive coupling will, however, occur as will imminently be explained). Electrodes of the buried-substrate capacitors located inside the monolithic, buried-substrate, multiple ceramic capacitor are brought out to side surfaces of the monolith, electrically conducted and routed—normally in and by conductive traces or conductive castellations—to the top surface of the monolith. These conductive traces—preferably as are integrally formed in the monolithic, buried-substrate, multiple ceramic capacitor as taught in the companion patent application for PRINTING AND ADHERING PATTERNED METAL ON A LAID-UP MULTI-LAYER GREEN WAFER BEFORE FIRING SO AS TO LATER FORM PRECISE INTEGRAL CO-FIRED CONDUCTIVE TRACES AND PADS ON SELECTED TOP AND BOTTOM SURFACES OF MONOLITHIC, BURIED-SUBSTRATE, CERAMIC MULTIPLE CAPACITORS DICED FROM THE WAFER, INCLUDING PADS SUPPORTING SURFACE MOUNTING AND/OR MOUNTING IN TIERS—are thereafter routed to the bores, and to the vicinity of the leads just as the leads exit the component and enter the bores.

It may also be considered that the length of each lead extends down-hole into a corresponding bore of the monolithic, buried-substrate, multiple ceramic capacitor. Each pair of leads experiences between them a relatively smaller, parasitic capacitance to all the capacitors that are within the monolithic, buried-substrate, multiple ceramic capacitor—including the capacitor to which direct electrical connection has been made. This relatively smaller, parasitic capacitance, is in electrical parallel with the relatively larger, directly electrically connected, capacitance. This parasitic capacitance is sometimes, rarely, used. However, it is a two or more capacitances that are directly connected that commonly serve together as a filter that is effective to filter noise in two or more separate frequency bands.

A top plan view of a preferred first embodiment of monolithic, buried-substrate, multiple capacitor 1 with through-holes 11 in accordance with the present invention is shown in FIG. 1. The capacitor 1 is suitable to closely physically mount a leaded amplifier/receiver 2 (not shown in FIG. 1, shown in FIG. 11), or like electrical component, to its through holes 11 simultaneously that it electrically connects dual capacitors to the same leaded amplifier/receiver 2.

Figure 2:
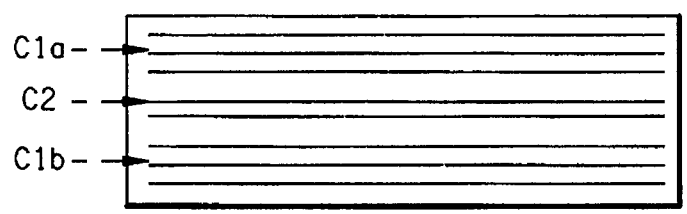
FIG. 2 is a cut-away side plan view of the first preferred embodiment of a monolithic, buried-substrate, multiple capacitor with through-holes in accordance with the present invention previously seen in FIG. 1.

A x-ray plan view of the preferred first embodiment of the monolithic, buried-substrate, multiple capacitor 1 in accordance with the present invention, taken along section A—A of FIG. 1, is shown in FIG. 2. Direct electrical connection to the buried-substrate capacitors C1a, C2, C1b that are within the monolithic, buried-substrate, multiple capacitor 1 is partially through the conductive traces 12a, 12b that surround bores 11a, 11c. No conductive trace surrounds bore 12b in this first embodiment of the invention.

The dielectrics of both capacitors C1a and C1b is preferably type X7R, making the net capacitance of each capacitor C1a, C1b about 0.5 microfarads (0.5 µF). The dielectric of capacitor C2 is preferably type NPO, making the net capacitance of this capacitor C2 100 picofarads (100 pF).

Figure 3:
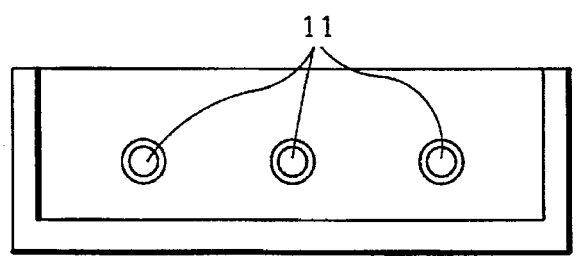
FIG. 3 is an x-ray plan view of a first, "A", conductive electrode plate of a first, C1a, buried substrate capacitor within the first preferred embodiment of a monolithic, buried-substrate, multiple capacitor previously seen in FIGS. 1 and 2, the view showing the spacing of the electrode plate from the through-holes.
Figure 4:
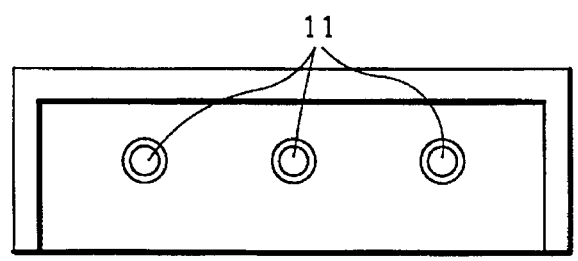
FIG. 4 is an x-ray plan view of a second, "B", conductive electrode plate of a second, C1b, buried substrate capacitor within the first preferred embodiment of a monolithic, buried-substrate, multiple capacitor previously seen in FIGS. 1 and 2, the view showing the spacing of the electrode plate from the through-holes.

X-ray plan views from the top of the first preferred embodiment of the monolithic, buried-substrate, multiple capacitor 1 are shown in FIGS. 3 and 4. A typical plate of the "a" capacitor C1a is shown in FIG. 3. A typical plate of the "b" capacitor C1b is shown in FIG. 4. Each of the plates is a buried metallization region, typically made of metal. Note that the metal is relieved circumferentially around the holes. The remainder of the body of the monolithic, buried-substrate, multiple capacitor 1 is ceramic.

Figure 5:
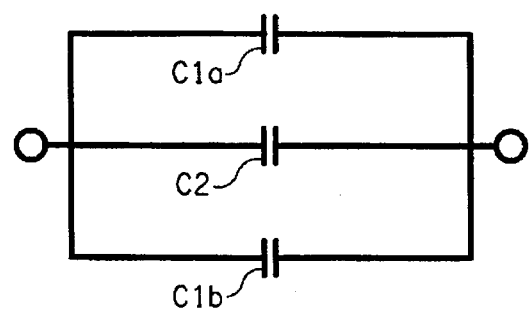
FIG. 5 is an electrical schematic diagram of the equivalent electrical circuit presented at two of its through-holes to an external electrical device by the exemplary first preferred embodiment of the monolithic, buried-substrate, multiple capacitor in accordance with the present invention as was previously seen in FIGS. 1 through 4.

An electrical schematic diagram of the equivalent electrical circuit—presented between through-holes 11a, 11c to an external electrical device therein connected to traces 12a, 12c—by the first preferred embodiment of the monolithic, buried-substrate, multiple capacitor 1 in accordance with the present invention is shown in FIG. 5. Each of the capacitors C1a and C1b—each about 0.5 µF—and the capacitor C2—about 100 pF—are connected in electrical parallel. The effective capacitance presented in about 1 µF in parallel with about 100 pF.

The equivalent electrical circuit presented by the monolithic, buried-substrate, multiple capacitor 1 at and between its two through-holes, or bores, 11a, 11c to the external electrical device 3 (shown in FIG. 8) is that of a microphone filter. Each of the capacitors C1a, C2, C1b are, in fact, buried substrate capacitors that are located inside the body of the monolithic, buried-substrate, multiple capacitor 1. The high value capacitors (C1a and C1b of about 0.5 µF) are made from high dielectric constant materials. The low value capacitor (C2 of about 100 PF) is made from low dielectric constant materials. Accordingly, the multiple capacitor 1 contains multiple different dielectric materials.

The manner of the electrical connection to the buried-substrate capacitors will become increasingly clear when the separate layers of the monolithic, buried-substrate, multiple capacitor 1 are shown in FIGS. 16–20. The effective 1 µF and 100 pF capacitances in electrical parallel serve to filter noise in two separate, high and low, frequency bands, typically centered about approximately 100 kHz and about approximately 100 MHz.

A side x-ray plan view of yet another, second, preferred embodiment of the monolithic, buried-substrate, multiple capacitor 2 is shown in FIG. 4, It may therein be recognized that each of the buried left metallization region 23a, central metallization region 23b, and right metallization region 23b are the plates of buried capacitors. Side conductive traces, or castellations, 24a, 14b are also visible.

Figure 6:
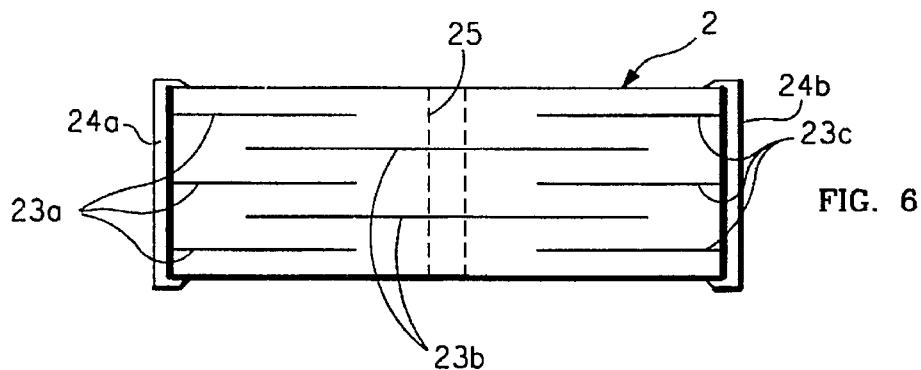
FIG. 6 is an cut-away side plan view of a second preferred embodiment of the monolithic, buried-substrate, multiple capacitor in accordance with the present invention.

Notably—and by reference to the illustrated principles of each of FIGS. 3, 4 and 6—a through-hole, or bore—for example bore 25 shown in FIG. 6—may be seen to pass right though one or more of the metallization regions 13a–13c (although the particular bore 25 passes only though the metallization regions 23b). In accordance with the present invention the bores 11 (see FIGS. 1, 3 and 4) and the bore 25 (se FIG. 6) are laser drilled. The drilling ablates and vaporizes the metal material of the metallization regions, for example metallization region 25 shown in the down-hole region of the bores 25 in FIG. 6. The interior surfaces of the bores 11, 25 are neither lined nor partially lined with metal (or anything else conductive), nor with residual metal. The leads 31 of a component 3 (see FIG. 8) that fit within the bores are not intended to make conductive electrical contact with anything that is down-hole within the bores, and do not make any such conductive electrical contact.

The cut-away side plan view—similar to the view of FIG. 2—of the second preferred embodiment of the monolithic, buried-substrate, multiple capacitor 2 shown in FIG. 6 particularly illustrates the manner in which the traces 24a, 24b connect over and down the sides of the monolithic, buried-substrate, multiple capacitor 2. These side connections are preferably in the form of conductive castellations as is taught in the related patent application Ser. No. 07/964, 150 filed on Oct. 21, 1992 for a MONOLITHIC MULTIPLE CAPACITOR to inventors Alan D. Devoe and Daniel F. Devoe, now issued as U.S. Pat. No. 5,367,430.

Figure 7:
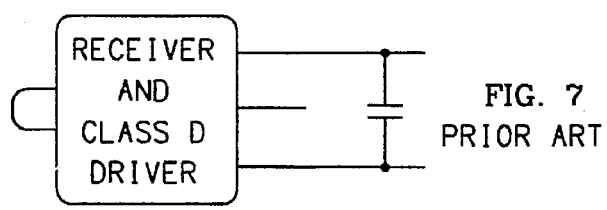
FIG. 7 is an electrical schematic diagram showing the prior art connection of a receiver or Class D driver to a capacitor within a monolithic, buried-substrate, multiple capacitor.

An electrical schematic diagram showing the prior art connection of a prior art receiver or Class D driver to a capacitor within a prior art monolithic, buried-substrate, multiple capacitor is shown in FIG. 7. Such a prior art monolithic, buried-substrate, multiple capacitor may be substantially the same as the either preferred embodiment of the monolithic, buried-substrate, multiple capacitors 1, 2 in accordance with the present invention save for a lack of through-holes, or bores, 11, 25.

Figure 8:
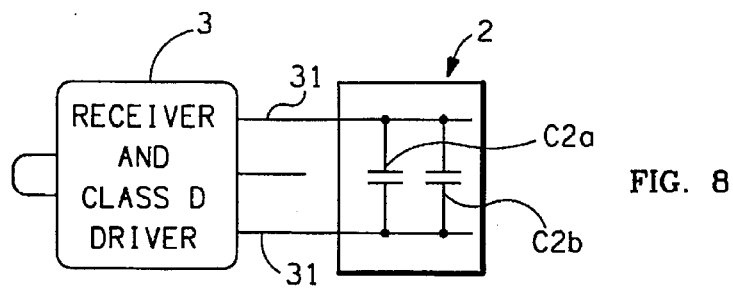
FIG. 8 is an electrical schematic diagram showing the connection of a receiver or Class D driver to a capacitor, and also, in electrical parallel, to a parasitic capacitors within the second preferred embodiment of the monolithic, buried-substrate, multiple capacitor in accordance with the present invention as was previously seen in FIG. 6.

For comparison to FIG. 7, an electrical schematic diagram showing the connection of a prior art receiver or Class D driver to the second preferred embodiment of the monolithic, buried-substrate, multiple capacitor 2 in accordance with the present invention is seen in FIG. 8. The connection the monolithic, buried-substrate, multiple capacitor 2 is not only easier, and mechanically more sound, but one combined physical and electrical connection suffices to effectively electrically connect two separate, parallel, capacitors C2a and C2b.

Figure 9:
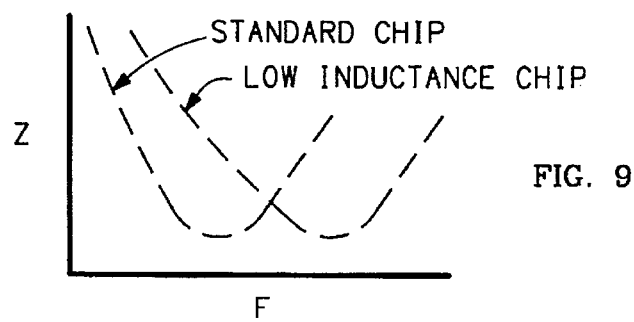
FIG. 9 is a graph showing the variation in impedance versus frequency for the second preferred embodiment of the monolithic, buried-substrate, multiple capacitor in accordance with the present invention as was previously seen in FIG. 6.
Figure 10:
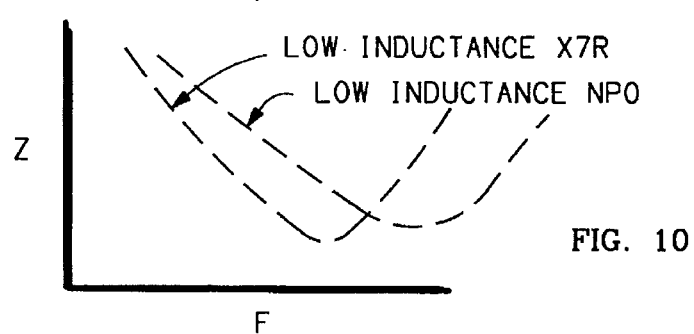
FIG. 10 is a graph showing the variation in impedance versus frequency for the first preferred embodiment of the monolithic, buried-substrate, multiple capacitor in accordance with the present invention as was previously seen in FIGS. 1 through 4.
Figure 14:
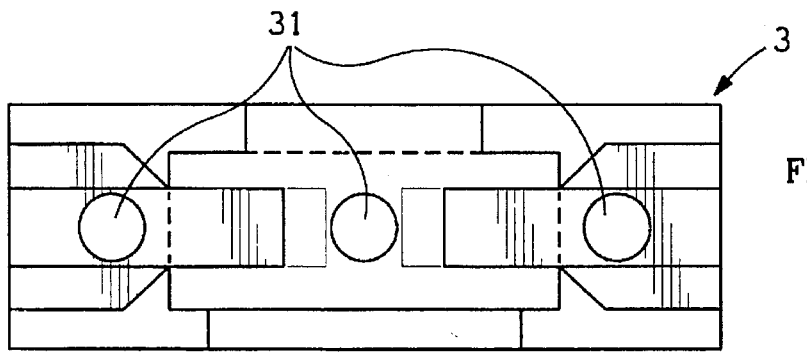
FIG. 14 is an x-ray plan view of conductive electrode plates of buried-substrate capacitors within the third preferred embodiment of a monolithic, buried-substrate, multiple capacitor previously seen in FIGS. 12 and 13, the view showing the spacing of the electrode plates from the through-holes.

A graph showing the variation in impedance versus frequency for a "STANDARD CHIP" and for a "LOW INDUCTANCE CHIP" is shown in FIG. 9. Either "CHIP" of this graph may be considered to be in accordance with the second embodiment of the monolithic, buried-substrate, multiple capacitor 6 shown in FIG. 6. A similar graph showing the variation in impedance versus frequency for a "STANDARD CHIP" made with dielectric material type X7R, and for a "LOW INDUCTANCE CHIP" made with dielectric material type NPO, is shown in FIG. 10. Each "CHIP" of this graph may be considered to be made in accordance with the first embodiment of the monolithic, buried-substrate, multiple capacitor 6 shown in FIG. 6.

The dual dielectric material of the first embodiment of the monolithic, buried-substrate, multiple capacitor 1—shown in FIGS. 1–4 and FIG. 10—permits this embodiment to have a greater range of impedance values than, for example, the single dielectric material of the second embodiment of the monolithic, buried-substrate, multiple capacitor 1—shown in FIG. 6 and FIG. 9.

The typical packaging of a typical prior art leaded receiver or Class D driver usable in conjunction with the preferred embodiment of the monolithic, buried-substrate, multiple capacitor 1 is shown in FIG. 11, consisting of FIGS. 11a though 11e. The leads 41 of the component 4 are particularly visible.

A top plan view showing a third preferred embodiment of monolithic, buried-substrate, multiple capacitor 3 with through-holes in accordance with the present invention is shown in FIG. 12. As with previous embodiments of the multiple capacitor 1, 2, the embodiment of the multiple capacitor 3 is suitable to closely physically mount a leaded amplifier/receiver to its through-holes while simultaneously electrically connecting a number of capacitors, particularly for the purpose of serving as an ultra-compact microminiature dual-capacitor filter to a hearing aid receiver.

A cut-away side plan view of the third preferred embodiment of a monolithic, buried-substrate, multiple capacitor 3 with through-holes in accordance with the present invention is shown in FIG. 13. The values of the contained capacitors C3a–C3d are over-marked on FIG. 13 for ease of comparison with the plates of some four (4) buried-substrate capacitors C3a–C3d that are located within this third embodiment of the ceramic multiple capacitor 3.

An x-ray plan view of conductive electrode plates of buried-substrate capacitors within the third preferred embodiment of a monolithic, buried-substrate, multiple capacitor 3—previously seen in FIGS. 12 and 13—is shown in FIG. 13. The spacing of the electrode plates from the through-holes 31 is illustrated.

Figure 15:
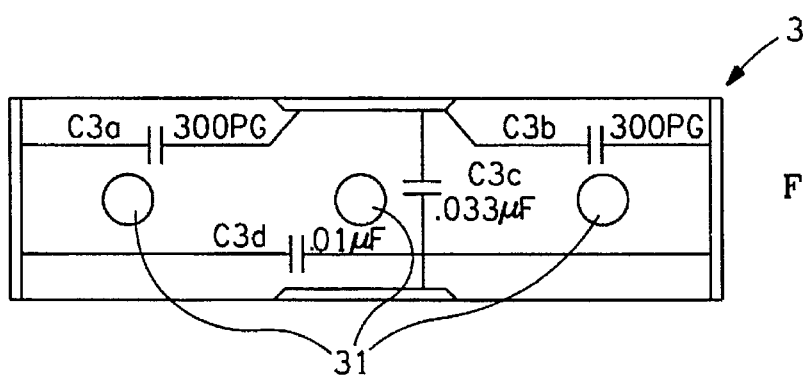
FIG. 15 is an diagrammatic view of the third preferred embodiment of monolithic, buried-substrate, multiple capacitor with through-holes in accordance with the present invention previously seen in FIGS. 12 though 14 now over-marked with schematic representations of the buried substrate capacitors that are electrically connected via the though-holes.
Figure 16A:
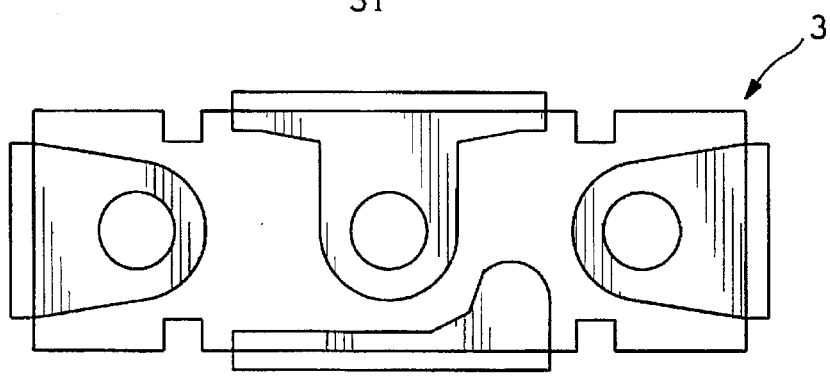
FIG. 16, consisting of FIG. 16a and FIG. 16b, is a diagram of a respective top, and side, plan view of a first, uppermost, set of layers of the third preferred embodiment of the monolithic, buried-substrate, multiple capacitor in accordance with the present invention as was previously seen in FIGS. 12 through 15.
Figure 16B:
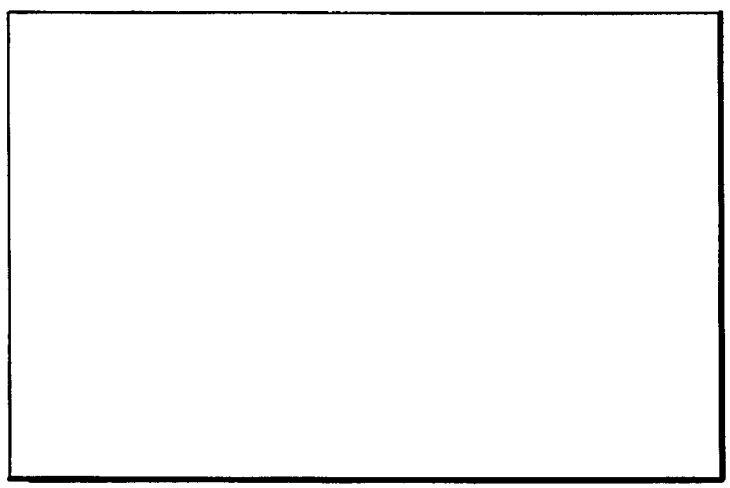
Figure 17A:
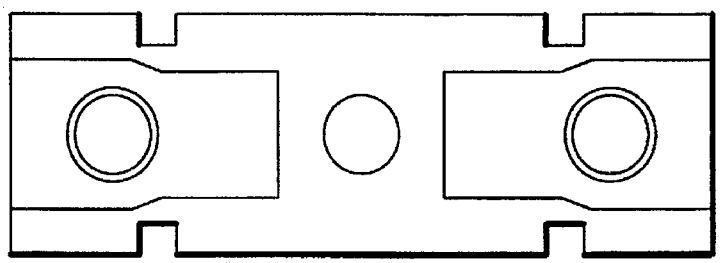
FIG. 17, consisting of FIG. 17a and FIG. 17b, is a diagram of a respective top, and side, plan view of a second set of layers of the third preferred embodiment of the monolithic, buried-substrate, multiple capacitor in accordance with the present invention as was previously seen in FIGS. 12 through 15.
Figure 17B:
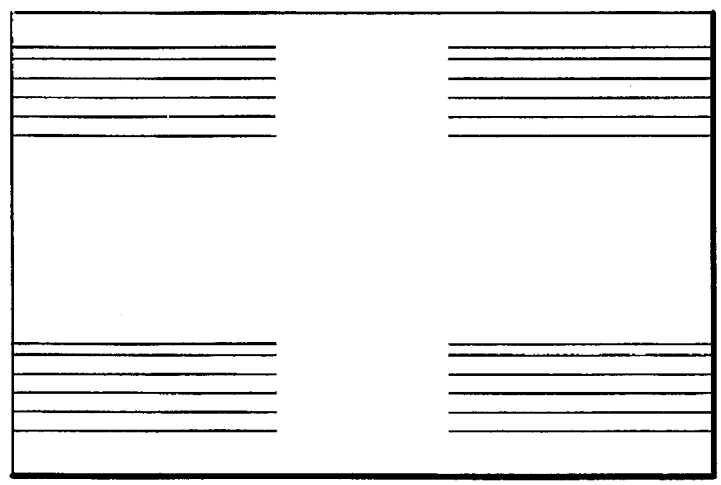
Figure 18A:
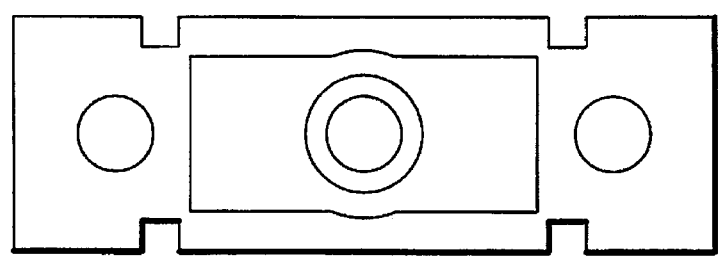
FIG. 18, consisting of FIG. 18a and FIG. 18b, is a diagram of a respective top, and side, plan view of a third set of layers of the third preferred embodiment of the monolithic, buried-substrate, multiple capacitor in accordance with the present invention as was previously seen in FIGS. 12 through 15.
Figure 18B:
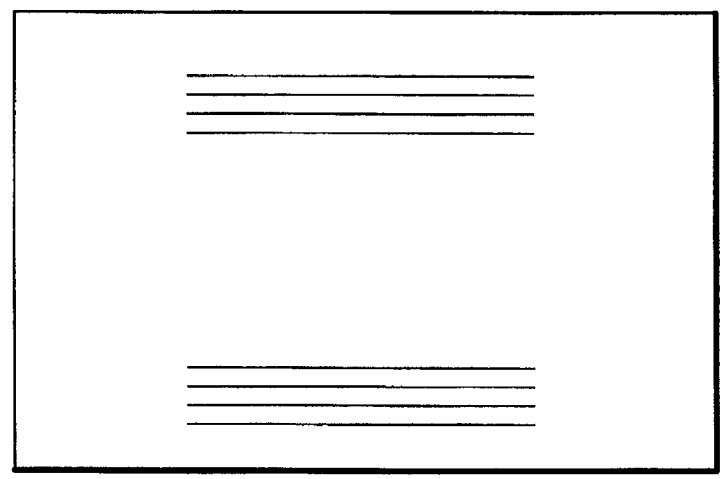
Figure 19A:
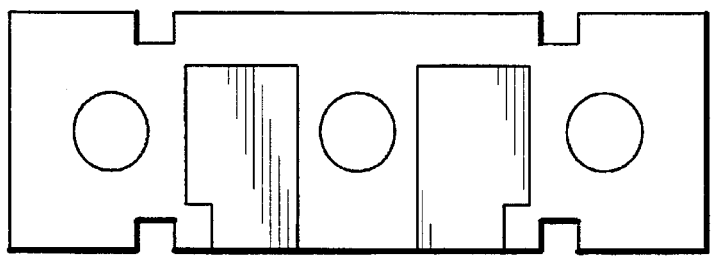
FIG. 19, consisting of FIG. 19a and FIG. 19b, is a diagram of a respective top, and side, plan view of a fourth set of layers of the third preferred embodiment of the monolithic, buried-substrate, multiple capacitor in accordance with the present invention as was previously seen in FIGS. 12 through 15.
Figure 19B:
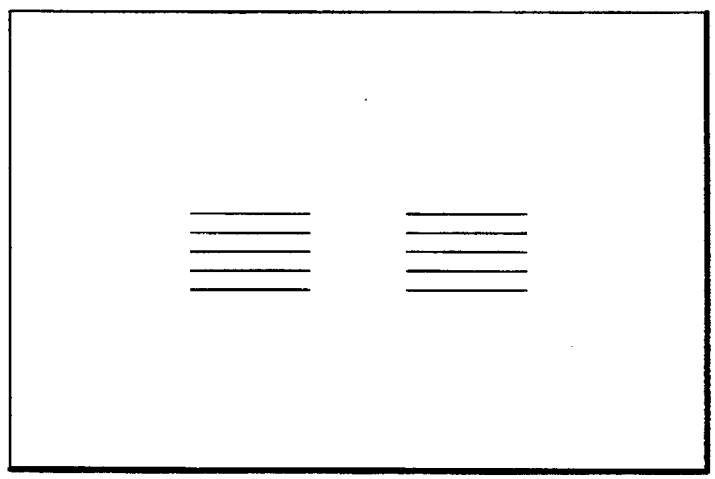
Figure 20A:
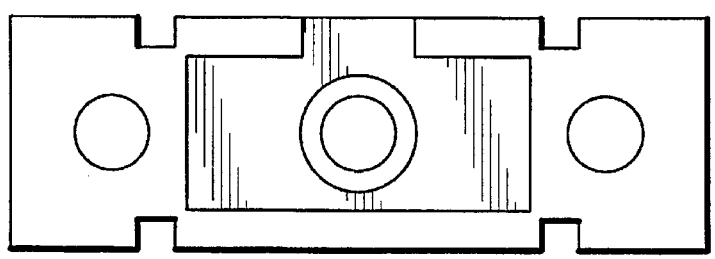
FIG. 20, consisting of FIG. 20a and FIG. 20b, is a diagram of a respective top, and side, plan view of a fifth, lowermost, set of layers of the third preferred embodiment of the monolithic, buried-substrate, multiple capacitor in accordance with the present invention as was previously seen in FIGS. 12 through 15.
Figure 20B:
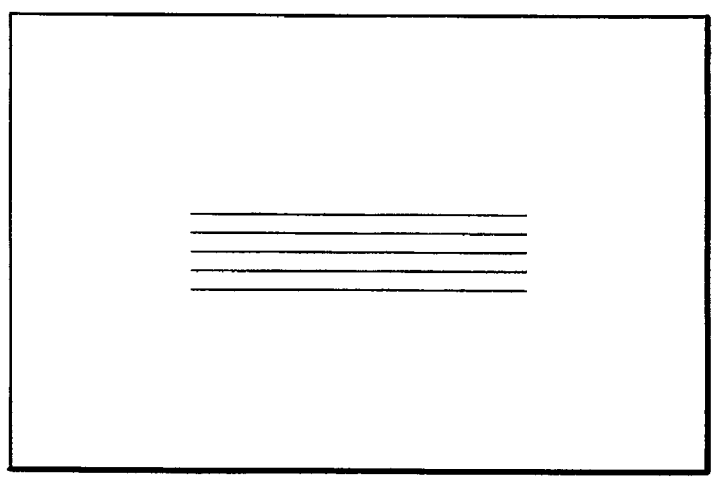

A diagrammatic representational view of the third preferred embodiment of the monolithic, buried-substrate, multiple capacitor 3 with through-holes in accordance with the present invention is shown in FIG. 15. Those same capacitances (arising from the buried substrate capacitors) that were over-marked in the representation of FIG. 13 are now again shown, this time with in conjunction with the electrical connection of same via the though-holes 31.

Plan views from the successively deeper layers within the preferred embodiment of the monolithic, buried-substrate, multiple capacitor 3 are shown in FIGS. 16–20, each FIG. 16–20 having both an "a" portion and a "b" portion. Plan views from the top of each successively deeper layer are shown in the "a" portion of FIGS. 16–20, i.e, in FIGS. 16a–20a. Plan views from the side of the same successively deeper layers are shown in the "b" portion—i.e., in FIGS. 16b–20b.

According to the preceding explanation, the present invention will have been understood to concern monolithic, buried-substrate, multiple capacitors where electrical components are physically both mechanically and thermally mounted to the monolith through their leads as fit within associated bores on the monolith. The electrical components are also electrically connected through their leads—but not as the leads contact the sides of the bore within the monolith. Instead, an electrically conductive circuit trace present upon the "top" of the monolith connects, thorough other conductive paths, the mounted electrical component to one or more capacitors within the monolith. Electrical connections may conveniently be made to the multiple buried-substrate electrodes of a single capacitor, or to the electrodes of multiple different capacitors—all as is required. Meanwhile, a parasitic capacitance experienced by the leads in their down-hole positions is in electrical parallel with the capacitance of this directly-connected, buried, capacitor. The two parallel capacitances serve a filter that is desirably effective in each of two separate frequency bands.

In accordance with the preceding explanation, certain adaptations and alterations of the present invention will suggest themselves to a practitioner of the electronic component, and electronic component interconnection, design arts. For example, the monolithic, buried-substrate, multiple capacitor need not have only a few (i.e., two or three) bores so as to mount and to connect just pone component, but may have and present a plurality of bores that suit the simultaneous connection, and filtering, of many different electrical components.

In accordance with these and other possible variations and adaptations of the present invention, the scope of the invention should be determined in accordance with the following claims, only, and not solely in accordance with that embodiment within which the invention has been taught.

What is claimed is:

1. A monolithic ceramic multiple capacitor that is susceptible of simultaneous physical and electrical connection to an external electrical device having at least two leads, the monolithic ceramic multiple capacitor comprising:

a three-dimensional body having and defining an exterior surface, and a plurality of bores that are suitable to physically receive the at least two leads of the external electrical device but which bores, while passing proximately to electrically-conducting plates of at least one buried-substrate capacitor, do not electrically connect anywhere with any plates of any buried-substrate capacitor;

at least one buried-substrate capacitor, located within the body, having both first and second electrically-conducting plates that do not electrically connect in nor at any bore, each of which plates is instead electrically separately brought to a surface of the body; and electrically conductive paths connecting each of the first and the second electrically-conducting plates as are brought to the surface of the body to further surface pad regions of the body that are positioned about a corresponding two of the plurality of bores into which corresponding two bores are received the at least two leads of the electrical device;

wherein the at least one buried substrate capacitor is susceptible of being electrically connected to, and across, the at least two leads of the electrical device when these at least two leads are inserted within the corresponding two bores and when electrical connection is made between each of the at least two leads and a surface pad region of the body that is positioned about the bore into which the lead is inserted, therein directly electrically connecting a first capacitance of this at least one buried substrate capacitor to the electrical device without electrically connecting through any bores.

2. The monolithic ceramic multiple capacitor according to claim 1 further comprising:

at least one other, second, buried-substrate capacitor, also located within the body and also having first and second electrically-conducting plates each of which plates is electrically separately brought to a surface of the body;

wherein the electrically conductive paths also connect to each of the first and the second electrically-conducting plates of the second buried-substrate capacitor as are brought to the surface of the body to the surface pad regions of the body that are positioned about the corresponding two of the plurality of bores;

wherein the electrical device physically mounted to the three-dimensional body by its at least two leads is susceptible of being electrically connected by its at least two leads to two, a first and a second, capacitances.

3. The monolithic ceramic multiple capacitor according to claim 1 wherein the plurality of bores within the three-dimensional body of the ceramic multiple capacitor are laser drilled.

4. The monolithic ceramic multiple capacitor according to claim 1 wherein the three-dimensional body comprises:

a plurality of interspersed layers of electrically-insulating sintered ceramic material, and of electrically-conducting material, which various layers are not co-extensive within the three-dimensional body;

wherein the at least one buried substrate capacitor comprises:

a first layer of electrically-conducting material forming the first electrically-conducting plate, and a second layer of electrically-conducting material forming the second electrically-conducting plate, which first and second layers are not co-extensive with each other within the three-dimensional body; and wherein at least one of the plurality of bores comprises:

a laser-drilled hole in the three-dimensional body that passes through both the first layer of electrically-conducting material and the second layer of electrically-conducting material without electrically connecting to either.

5. The monolithic ceramic multiple capacitor according to claim 1 wherein the electrical non-connection of the bores in the three-dimensional to either the first or the second layer of electrically-conducting material is due to patterning of the first and second layer so as to be spaced apart from the bores.

6. A monolithic ceramic multiple capacitor that is susceptible of simultaneous physical and electrical connection to an external electrical device having at least two leads, the monolithic ceramic multiple capacitor comprising:

a three-dimensional body having and defining an exterior surface, and a plurality of bores that are suitable to physically receive the at least two leads of the external electrical device; which bores pass proximately to but do not electrically connect with at least one buried-substrate capacitor, located within the body, having first and second electrically-conducting plates each of which plates is electrically separately brought to a surface of the body;

electrically conductive paths connecting each of the first and the second electrically-conducting plates as brought to the surface of the body to further surface pad regions of the body that are positioned about a corresponding two of the plurality of bores into which corresponding two bores are received the at least two leads of the electrical device;

wherein the at least one buried substrate capacitor is susceptible of being electrically connected to, and across, the at least two leads of the electrical device when these at least two leads are inserted within the corresponding two bores and when electrical connection is made between each of the at least two leads and a surface pad region of the body that is positioned about the bore into which the lead is inserted, therein directly electrically connecting a first capacitance of this at least one buried substrate capacitor to the electrical device; and wherein the conductive pads are suitably reflow soldered to the two leads of the electrical device that are inserted within a corresponding two bores.

7. A monolithic ceramic multiple capacitor comprising:

a three-dimensional body having and defining at least two bores; each of the two bores passing proximately to but not electrically connecting with at least one buried-substrate capacitor within the body;

electrically conductive pads at entrances to the bores; and electrically conductive paths connecting the at least one buried-substrate capacitor to the pads;

wherein when two leads of an external electrical device are inserted within the two bores then these leads pass proximately to, but do not electrically connect with, the at least one buried-substrate capacitor, at and from their positions within the bores;

wherein when two leads of the external electrical device that are inserted within the two bores are soldered to the pads than the buried-substrate capacitor is connected to the external electrical device;

wherein when two leads of the external electrical device are inserted within the two bores and soldered to the pads then the electrical device is physically mounted to the three-dimensional body of the buried substrate capacitor.

8. The monolithic ceramic multiple capacitor according to claim 7 wherein the at least two bores within the three-dimensional body of the ceramic multiple capacitor are laser drilled.

* * * * *